United States Patent [19]
Hussein et al.

[11] Patent Number: 6,020,266
[45] Date of Patent: Feb. 1, 2000

[54] SINGLE STEP ELECTROPLATING PROCESS FOR INTERCONNECT VIA FILL AND METAL LINE PATTERNING

[75] Inventors: Makarem Hussein; Kevin J. Lee, both of Beaverton; Sam Sivakumar, Hillsboro, all of Oreg.

[73] Assignee: Intel Corporation, Santa Clara, Calif.

[21] Appl. No.: 09/001,349

[22] Filed: Dec. 31, 1997

[51] Int. Cl.$^7$ .................................................. H01L 21/00
[52] U.S. Cl. ........................ 438/694; 438/699; 438/700; 438/702; 216/18; 216/20
[58] Field of Search .................................. 438/689, 691, 438/694, 695, 699, 669, 639, 700, 702; 216/18, 20

[56] References Cited

U.S. PATENT DOCUMENTS

| | | |
|---|---|---|
| 3,705,069 | 12/1972 | Stork . |
| 4,016,050 | 4/1977 | Lesh et al. . |
| 4,996,133 | 2/1991 | Brighton et al. ........................ 430/313 |
| 4,996,584 | 2/1991 | Young et al. . |
| 5,151,168 | 9/1992 | Gilton et al. . |
| 5,209,817 | 5/1993 | Ahman et al. ........................... 156/643 |
| 5,270,254 | 12/1993 | Chen et al. .............................. 437/190 |
| 5,371,410 | 12/1994 | Chen et al. .............................. 257/750 |
| 5,429,958 | 7/1995 | Mastlock .................................... 437/34 |
| 5,436,504 | 7/1995 | Chakravorty et al. . |
| 5,487,999 | 1/1996 | Farnworth .................................. 437/7 |
| 5,500,559 | 3/1996 | Miyata et al. . |
| 5,866,945 | 2/1999 | Chen et al. .............................. 257/750 |

*Primary Examiner*—Felisa Garrett
*Assistant Examiner*—Kin-Chan Chin
*Attorney, Agent, or Firm*—Blakely, Sokoloff, Taylor & Zafman LLP

[57] ABSTRACT

A single step electroplating process for interconnect via fill and metal line formation on a semiconductor substrate is disclosed. In this process, a barrier layer is formed onto a surface of a substrate that has at least one via and then a conductive layer is formed onto the barrier layer. Next, a photoresist layer is applied and patterned on top of the conductive layer. The via plugs and metal lines are then deposited on the substrate simultaneously using an electroplating process. After the electroplating process is completed, the photoresist and the conductive layer between the deposited metal lines are removed. The process provides a simple, economical and highly controllable means of forming metal interconnect systems while avoiding the difficulties associated with depositing and patterning metal by traditional semiconductor fabrication techniques.

18 Claims, 4 Drawing Sheets

SINGLE STEP ELECTROPLATING PROCESS FOR INTERCONNECT VIA FILL AND METAL LINE PATTERNING

BACKGROUND OF THE INVENTION

(1) Field of the Invention

This invention generally relates to fabrication of interconnect systems. More specifically, this invention relates to fabrication of via plugs and metal lines in interconnect systems.

(2) Background Information

Integrated circuits are generally manufactured starting from a substrate, typically made of silicon, that includes numerous active and passive devices such as transistors, capacitors and resistors. Such devices are initially isolated from one another but are later interconnected together to form functional circuits. Interconnects typically include metal lines which connect the various active and passive devices formed in the substrate. Interconnects also include vias which connect various layers of metal lines therebetween within the interconnect system. The quality of the interconnection of these devices drastically affects the performance and reliability of the fabricated integrated circuit. The process of connecting the devices by interconnects is known as metallization. Current semiconductor fabrication processes typically utilize Aluminum as metal for interconnects. Aluminum is superior to the other metals such as copper, gold, and silver, for example, in terms of relative ease of deposition and patterning onto the semiconductor substrate. However, Aluminum is not an ideal metal for interconnects because of its lower conductivity and poor electromigration characteristics relative to the other metals mentioned above.

As semiconductor devices shrink in size and processing speeds of these devices become faster due to advanced manufacturing techniques, the conductivity of the interconnect metal has become critical making metals such as copper highly desirable for metallization. The conductivity of the interconnect has become even more critical in the area of ULSI manufacturing where the width of the interconnects are within sub-half-micron ranges. Accordingly, metals with high conductivity, such as copper, have become highly desirable in interconnect systems. One process utilizing copper, known as "Damascene", involves etching a dielectric layer such as silicon oxide, deposited on the surface of the substrate, to form patterned vias and oxide trenches. Copper is then deposited into the patterned vias and oxide trenches by way of sputtering or electroplating. Unwanted copper deposits are then removed from the surface of the substrate using conventional chemical-mechanical polishing (CMP) methods. However, this process is highly complicated and not readily controllable.

In processes, similar to the Damascene process, copper is deposited by electroplating. Using electroplating for metal deposition has its shortfalls. For example, copper tends to diffuse into the underlying and adjacent dielectric layer which usually results in a defective fabricated circuit. Therefore, typically, a barrier layer using compounds such as titanium-nitride needs to be formed on the substrate to prevent such diffusion. Unfortunately, copper does not adhere well to the barrier layer during electroplating resulting in poor interconnects. In ULSI manufacturing where the interconnects have widths in the sub-half-micron range, the poor adhesion results in defects which are usually fatal to the fabricated integrated circuit.

Consequently, the industry has turned to a number of copper electrolytic solutions to address this problem, a promising solution being copper cyanide in basic solution. However, if copper cyanide in basic solution accidentally comes in contact with an acidic solution, a byproduct of highly toxic cyanide gas is formed. Thus, the use of copper cyanide in basic solution is strongly discouraged in manufacturing for safety reasons. Accordingly, it is desirable to provide a metallization process using a desired metal having high conductivity, in an interconnect system, which overcomes the above mentioned shortcomings and is simple, economical, and highly controllable.

SUMMARY OF THE INVENTION

The present invention provides a method of forming an interconnect system. A barrier layer is formed onto a surface of a substrate that has at least one via. A conductive layer is formed onto the barrier layer. A photoresist layer is formed onto the conductive layer. The photoresist layer is patterned. A metal via plug is formed onto the at least one via. A metal line is formed onto said metal via plug. The layer of photoresist is removed. The conductive layer, not covered by the metal line, is removed.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description more specific details and examples have been set forth to provide a thorough understanding of the present invention. However, the specific details and examples do not limit the boundaries of the present invention and one having skilled in the ordinary art will recognize that the invention can be practiced without these specific details and examples. In some instances, well known structures, processes and techniques have not been illustrated to avoid unnecessarily obscuring the present invention.

Figure 1:
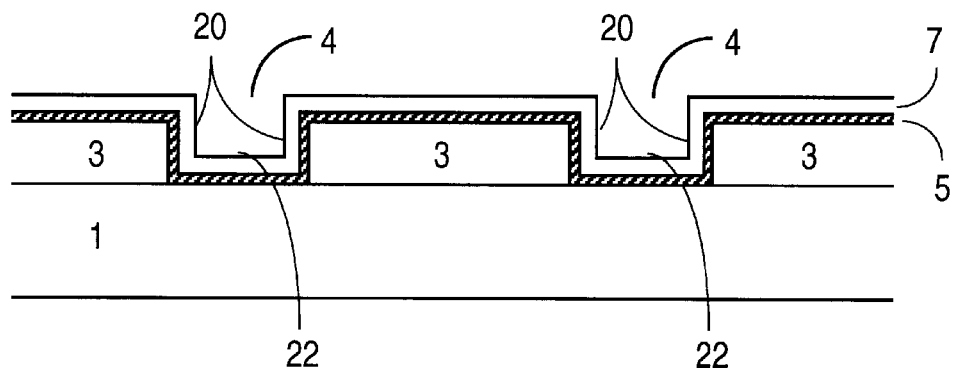
FIG. 1 illustrates a cross-sectional view of a via-patterned substrate with a barrier layer and a conductive layer formed onto a surface of the substrate.

FIG. 1 illustrates a semiconductor substrate 1 onto which a dielectric layer 3 (oxide in the embodiment of the present invention described herein) has been deposited and via-patterned using a standard via patterning technique. Vias 4 are formed within dielectric layer 3. A thin barrier layer 5 including a conductive or an insulating material is formed over dielectric layer 3. The barrier layer 5 also covers the walls 20 that define vias 4 and the bottom surfaces 22 of vias 4. Barrier layer 5 prevents a metal line 11 that is later deposited in each via 4, from diffusing into the underlying and adjacent dielectric layer 3. Diffusion of the metal into the dielectric layer 3 may cause defects in the fabricated integrated circuit.

Typical a thickness of barrier layer 5 depends on the metal to be deposited and the condition in which the metallization process is used. As an example, for copper, typically, a 15–30 nm barrier layer thickness is sufficient to prevent diffusion. Appropriate, conductive materials for the barrier layer 5 may be titanium nitride or tantalum, for example, if the barrier 5 layer includes a conductive material. It is conceivable to persons skilled in the art that an insulating material may be used for barrier layer 5. In this case, the barrier layer would have to be removed from the vias 4 at the end of the process so that the barrier layer 5 does not block or interfere with the conduction of current through vias 4. One example of insulating materials of which barrier layer 5 could be made is silicon nitride.

Figure 3:
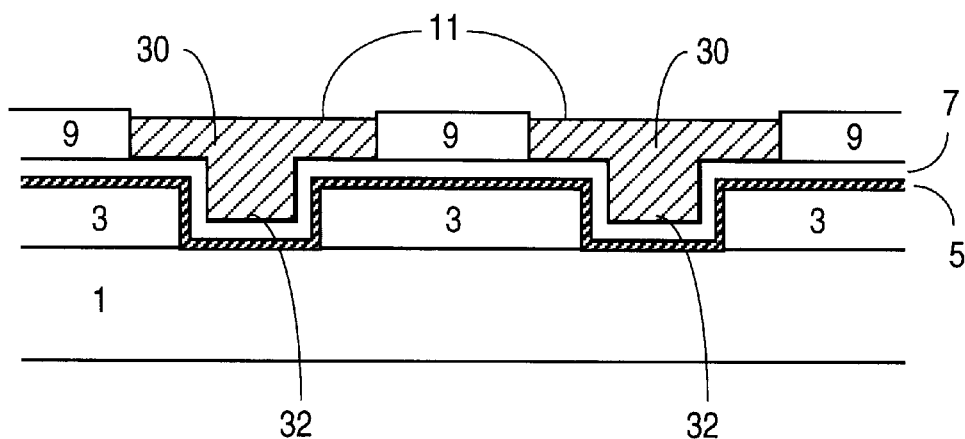
FIG. 3 illustrates a cross-sectional view of the substrate with a metal deposited to form via plugs and metal lines.

Next, a thin conductive layer 7 is deposited over barrier layer 5. This layer conducts an electric current therethrough which is used in an electroplating process to form a metal 11 onto the via 4 and a metal line 30 (FIG. 3) onto via plug 32 (FIG. 3). The electroplating process utilized to deposit the metal 11 will be further described later in this section. While barrier layer 5 including a conducting material such as a titanium compound is also capable of carrying a current that may be utilized in the electroplating process, barrier layer 5 is not such a good conductor and may cause non-uniform current flow. The non-uniform current flow may cause non-uniform formation of via plugs 32, and of the metal lines 30 during electroplating resulting in poor quality metal lines 30 and via plugs 32 which adversely affect the reliability of the fabricated integrated circuit.

Conductive layer 7 provides uniform deposition of the metal via plugs 32 and of metal lines 30 during electroplating allowing current to uniformly flow therethrough. Moreover, conductive layer 7 also provides enhanced adhesion of the via plugs 32 and metal lines 30 to the substrate 1. It is preferred that conductive layer 7 includes the same metal, or a metal with a same crystalline orientation, as the metal to be deposited into the via 4. For example, if copper is to be used as an interconnect metal for substrate 1, it is preferable that conductive layer 7 includes copper or a metal with same crystalline orientation such as nickel, for example. However, conductive layer 7 may include other metals to achieve the desired result. Various processes may be used to apply the conductive layer 7 to the barrier layer 5. One such process is sputtering. Sputtering is a deposition process well-known in the art.

Figure 2:
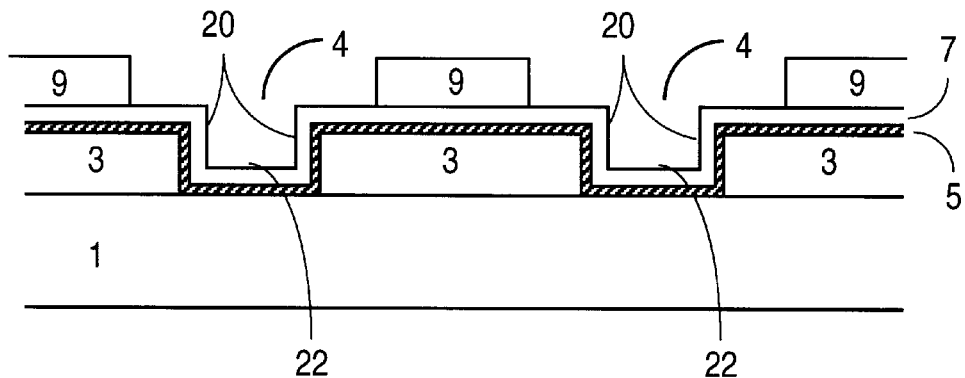
FIG. 2 illustrates a cross-sectional view of the substrate with a developed and fixed photoresist.

FIG. 2 illustrates a cross-sectional view through the substrate after a layer of photoresist 9 (hereinafter referred to as "photoresist 9") has been applied, exposed to light through a predetermined metal pattern mask, and developed using photolithography techniques known in the art. After the photoresist 9 is applied and patterned, the photoresist 9 remains in the areas where the deposition of metal is not desired. Because photoresist 9 is an electrically insulating material, photoresist 9 prohibits the passage of electrical current between the conductive layer 7 and an electroplating bath which is described later. This results in the deposition of metal 11 only in those areas where there is no photoresist.

Typically, in ULSI manufacturing processes, positive tone photoresists are used in the metallization process of integrated circuits. A positive tone photoresist is a photoresist which undergoes a chemical change when exposed to light. Those portions of the photoresist which have been exposed to light wash away in the developer when the photoresist is developed. A positive tone photoresist is not adequate for substrates with vias such as the ones utilized in connection with the present invention because it is difficult to sufficiently expose the photoresist to light to a depth of a via plus a metal line thickness which is typically about 1.5 microns or greater. This may cause portions on the photoresist to remain in the vias during developing, thereby preventing formation of metal in the vias during electroplating.

This difficulty is avoided in the present invention by using a negative tone photoresist. A negative tone photoresist is a resist that undergoes a chemical change when exposed to light. Those portions of the photoresist which have not been exposed to light wash away in the developer when the photoresist is developed. Consequently, when a negative tone photoresist is used to mask areas where metal deposition is not desired in the present invention, only the photoresist deposited in the spaces where the metal lines are not desired, i.e., between the spaces dedicated to metal lines, needs to be sufficiently exposed to light so that this resist will remain after developing. The photoresist deposited in the spaces where the metal lines are not desired is typically 0.5 to 0.8 microns in depth, and proper light penetration to this depth is easily achievable using commercially available negative tone photoresists and current photolithography techniques.

FIG. 3 illustrates a cross-sectional view of substrate 1 in connection with deposition of a metal via plugs 32 and metal lines 30. While two via plugs and metal lines are shown in the Figure the following discussion will focus on one via plug and one metal line being understood that the discussion equally applies to all via plugs and metal lines. Via plug 32 and metal line 30 are formed by using an electroplating process. By way of example, a pH neutral copper-based solution such as a copper sulfate based solution in the range of pH 6.5 to 7.5 may be used as an electroplating bath if copper is the desired metal to be deposited. Because the neutral pH solution does not chemically attack the applied photoresist 9, the advantage of the neutral pH solution is that the integrity of the photoresist pattern is maintained during the electroplating process and hence the deposition of the metal in undesired areas is prohibited. Copper sulfate based pH neutral electroplating solutions are commercially available from the Electroplating Engineers of Japan, Ltd. (EEJA). In the electroplating process, a current is applied between the conductive layer 7 and an anode of an electroplating cell (not shown). Negative charge build-up on the conductive layer 7 causes metal ions from the electroplating bath to be reduced to metallic state, and hence metal 11 becomes deposited onto the conductive layer, wherever such conductive layer 7 is not covered by photoresist. It has been demonstrated that the growth rate on the sidewall is slower than the growth rate on the bottom of the via trench. Consequently, an electroplating process can fill substrate vias without void formation.

Figure 4:
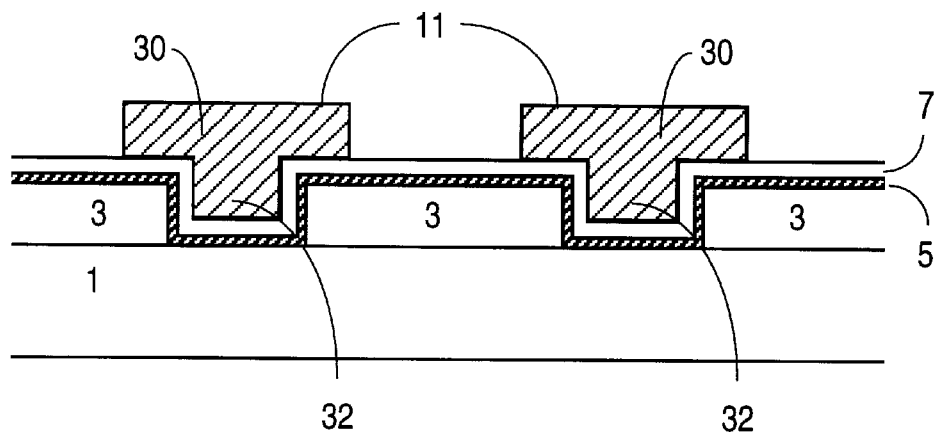
FIG. 4 illustrates a cross-sectional view of the substrate with via plugs and metal lines after the photoresist is stripped.

FIG. 4 illustrates a cross-sectional view of the substrate 1 in connection with the removal of the photoresist after the deposition of the metal 11 by electroplating. Photoresist is typically removed by well-known and conventional wet or dry processes.

Figure 5:
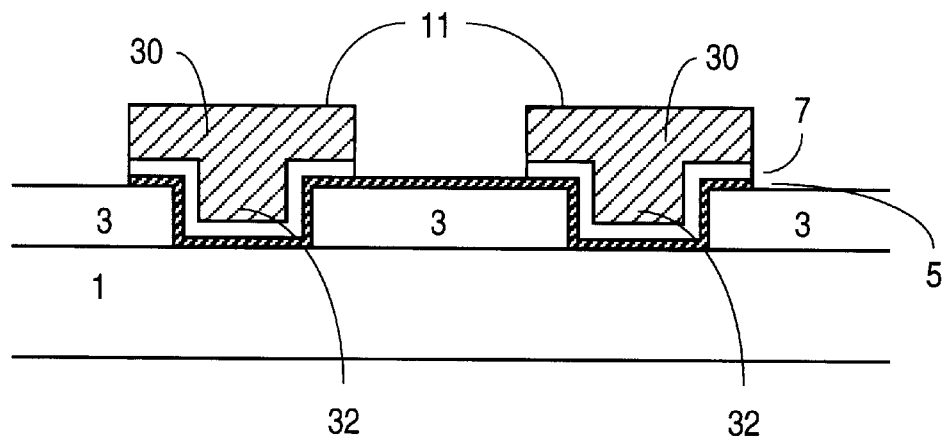
FIG. 5 illustrates a cross-sectional view of the substrate with via plugs and metal lines after the conductive layer and the barrier layer are removed.

FIG. 5 illustrates a cross-sectional view of substrate 1 where the conductive layer 7 and barrier layer 5 have been removed around metal lines 30. This step is important to prevent electrical short circuits between the metal lines 30. A plurality of metal lines 30 spaced from each other may be obtained by way of the process described herein. A selective wet etch or sputter etch process may be used to remove the conductive layer 7 and barrier layer 5 from the substrate 1. These processes are well known in the art. However, in the case where barrier layer 5 is comprised of an insulating material, only the conductive layer 7 is removed.

Figure 6:
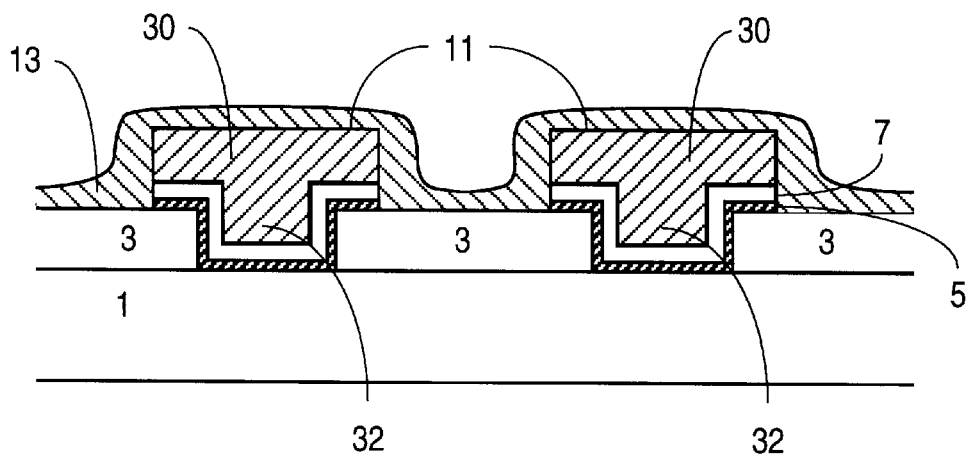
FIG. 6 illustrates a cross-sectional view of the substrate with an optional diffusion barrier layer formed on the via plugs and metal lines.

FIG. 6 illustrates a cross-sectional view through substrate 1 showing metal lines 30 encapsulated by a thin layer of an insulating material 13 which is conformally deposited onto the metal lines 30. Insulating material 13 may be, by way of non-limiting example, plasma enhanced silicon nitride. Silicon nitride acts as a diffusion barrier layer preventing metal diffusion from the metal line sidewall into the adjacent dielectric layer 3.

Figure 7A:
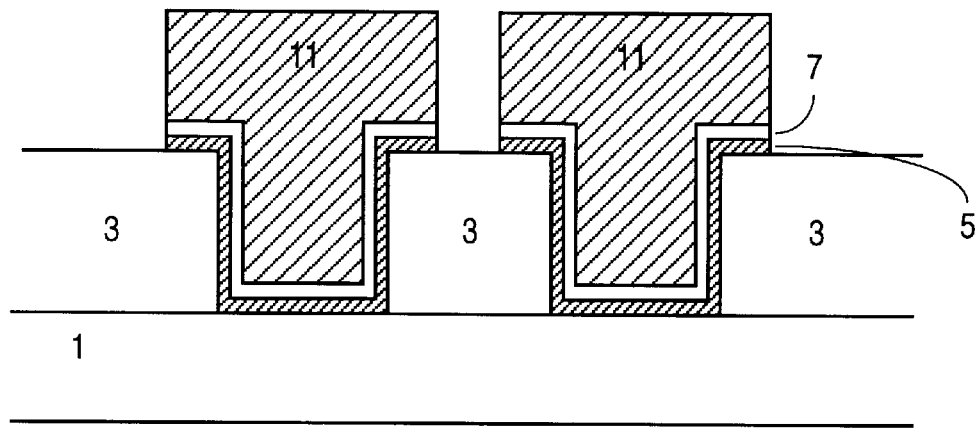
FIGS. 7a and 7b illustrate a cross-sectional view of a portion of an integrated circuit (IC) formed by the process of the present invention with FIG. 7a showing the portion of the IC without the diffusion barrier layer and FIG. 7b showing the portion of the IC with a diffusion barrier layer.
Figure 7B:
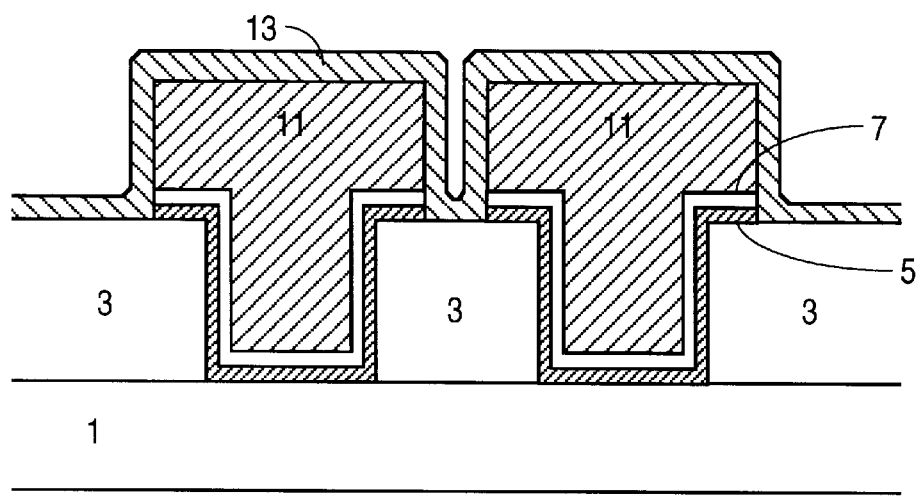

FIGS. 7a and 7b illustrate portions of an integrated circuit (IC) with via plugs and metal lines fabricated by way of the process described above. FIG. 7a shows the portion of the IC without the diffusion barrier layer. FIG. 71b shows the portion of the IC with a diffusion barrier layer 13.

Figure 8:
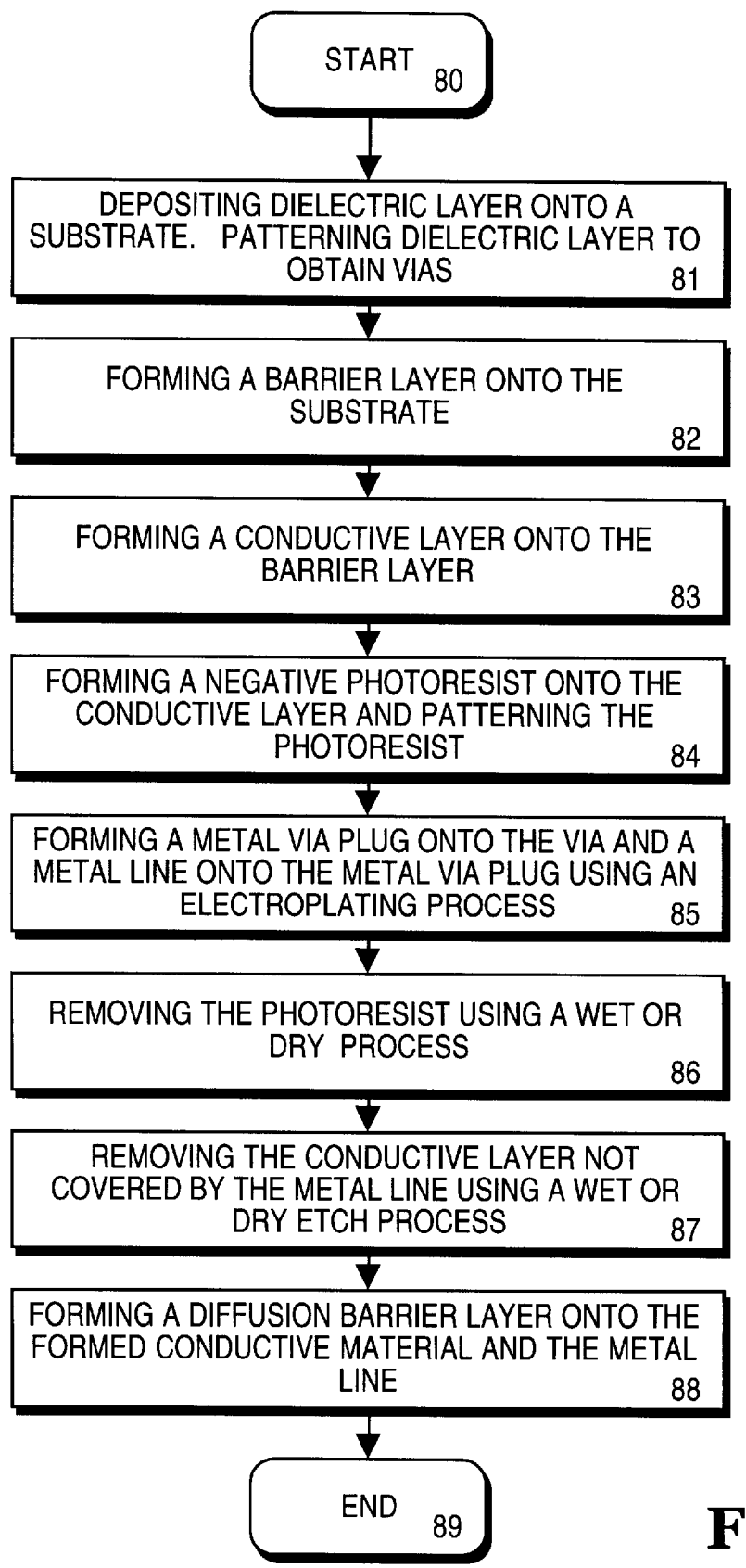
FIG. 8 illustrates a flow chart depicting the steps of an embodiment of a process according to the present invention.

FIG. 8 shows a flow chart that illustrates the process of an embodiment of the present invention. At block 81, a dielectric layer is deposited onto the substrate and patterned to obtain vias. At block 82, a barrier layer is formed onto the substrate. At block 83, a conductive layer is formed onto the barrier layer. At block 84, a negative photoresist is formed onto the conductive layer and the photoresist is patterned. At block 85, a metal via plug is formed onto a via and a metal line is formed onto the metal via plug by an electroplating process. At block 86, the photoresist is removed using a wet or dry etch process. At block 87, the conductive layer is removed using a wet or dry etch process. At block 88, a diffusion barrier layer is formed onto the conductive material.

In the foregoing specification, the invention has been described with reference to specific embodiments thereof. It will, however, be evident that various modifications and changes can be made to the specific references without departing from the spirit and scope of the invention. Accordingly, the specification and drawings are to be regarded in an illustrative rather than a restrictive sense and the invention should not be limited except as by the accompanying claims.

What is claimed is:

1. A method of forming an interconnect system, the method comprising:
   (a) forming a barrier layer onto a surface of a substrate that has at least one via;
   (b) forming a conductive layer onto the barrier layer;
   (c) forming a photoresist layer onto the conductive layer and patterning said photoresist layer;
   (d) forming a conductive via plug onto said at least one via and forming a conductive interconnect line onto said conductive via plug;
   (e) removing the layer of photoresist; and
   (f) removing the conductive layer not covered by said conductive interconnect line.

2. The method of claim 1, wherein (c) further comprises applying a negative photoresist layer onto the conductive layer; and patterning the negative photoresist layer.

3. The method of claim 1, wherein (d) further comprises forming the conductive via plug and the conductive line by way of an electroplating process.

4. The method in claim 3, wherein the conductive layer is a material that has a same crystalline structure as the material to be deposited by electroplating.

5. The method in claim 3, wherein forming the conductive via plug and the conductive line by way of an electroplating process comprises immersing the substrate with the barrier layer and the conductive layer in an electroplating solution that does not chemically attack the photoresist.

6. The method of claim 5 wherein said electroplating solution includes a solution of copper sulfate having a pH range about 6.5 to 7.5.

7. The method of claim 1, wherein the barrier layer comprises a material that prevents a metal of which the conductive via plug and the conductive line are made, from diffusing through the barrier layer.

8. The method of claim 7, wherein the barrier layer comprises a compound including titanium.

9. The method in claim 7, wherein the barrier layer comprises a compound including tantalum.

10. The method in claim 1, wherein the barrier layer comprises an insulating material.

11. The method in claim 10, wherein the barrier layer comprises a compound including silicon nitride.

12. The method in claim 1, wherein the conductive layer is a material that is electroplatable.

13. The method in claim 1, wherein the conductive layer is a material selected from group consisting of cooper, gold, nicker and silver.

14. The method in claim 1, wherein the step of removing the conductive layer includes using a wet etch process.

15. The method in claim 1, wherein the step of removing the conductive layer includes using a dry etch process.

16. The method in claim 1, further comprising the step of adding a diffusion barrier on the formed conductive material after the removal of the conductive layer.

17. The method in claim 16, wherein the diffusion barrier layer is a compound comprising silicon nitride.

18. The method of claim 1 wherein said conductive via plug and said conductive line include copper.

* * * * *